United States Patent

Miyata et al.

[11] Patent Number: 5,450,013
[45] Date of Patent: Sep. 12, 1995

[54] SPARK PLUG VOLTAGE DETECTOR PROBE HAVING A REPLACEABLE CABLE FIXING PORTION

[75] Inventors: Shigeru Miyata; Noriaki Kondo, both of Nagoya, Japan

[73] Assignee: NGK Spark Plug Co., Ltd., Nagoya, Japan

[21] Appl. No.: 180,313

[22] Filed: Jan. 12, 1994

[30] Foreign Application Priority Data

Jan. 12, 1993 [JP] Japan .................................. 5-003340

[51] Int. Cl.⁶ ............................................. F02P 17/00
[52] U.S. Cl. ...................................... 324/393; 324/402
[58] Field of Search ......................... 324/393, 399, 402; 73/116, 118.1

[56] References Cited

U.S. PATENT DOCUMENTS 5,317,268 5/1994 Maruyama et al. .................. 324/402

*Primary Examiner*—Walter E. Snow
*Attorney, Agent, or Firm*—Sughrue, Mion, Zinn, Macpeak & Seas

[57] ABSTRACT

A spark plug voltage waveform detector probe for use in an internal combustion engine and which is mounted on a secondary circuit of an ignition circuit to form static capacity therebetween so as to detect a spark plug voltage waveform. The detector probe includes an insulator body and an electrode plate which is embedded in the insulator body and electrically connected to a lead wire. A pair of readily replaceable insulator plates are located under the insulator body each of the insulator plates having at least one groove, the at least one groove of each of the insulator plates opposing each other and cooperating to form an opening in which a spark plug cable is placed which is extended from the secondary circuit. Electromagnetic shield plates are provided to liquid-tightly sandwich the insulator body and the insulator plates so as to form a laminated detector probe structure. The electromagnetic shield plates are electrically connected to the internal combustion engine for grounding.

2 Claims, 5 Drawing Sheets

SPARK PLUG VOLTAGE DETECTOR PROBE HAVING A REPLACEABLE CABLE FIXING PORTION

BACKGROUND OF THE INVENTION

1. Field of the Invention

This invention relates to a spark plug voltage detector probe which is provided to detect a spark plug voltage waveform induced from a secondary circuit of an ignition circuit to be applied to a spark plug in an internal combustion engine.

2. Description of Prior Art

With the demand of purifying emission gas and enhancing fuel efficiency of internal combustion engines, it has been necessary to detect firing conditions in each cylinder of the internal combustion engine so as to protect the internal combustion engine against any type of misfire. In order to detect the firing condition in each of the cylinders, the applicant of the present patent application discloses a misfire detector device in Japanese Patent Appln. No. 3-314783. This device is based on the finding that the misfire in each cylinder is distinguished by detecting a voltage waveform across the spark plug, and analyzing its attenuation characteristics. On the basis of the finding, an electrode plate sensor is embedded in an insulator body which has a plurality of Grooves which have the same diameter as a spark plug cable has. The spark plug cable is placed in the Grooves to form static capacity between the electrode plate sensor and the cable. A lid plate is secured to the insulator body to fix the cable by means of a screw.

In another Japanese Patent Appln. No. 4-303859, an electrode plate is placed in an accommodation space filled with silicone rubber. A spark plug cable is sandwiched by a pair of rubber plates, and placed in Grooves which are diametrically equivalent to the spark plug cable. These rubber plates are interfit into a cavity provided in the accommodation space.

In these types of spark plug voltage detector probes, it is quinteessential to detect the change of the static capacity formed between the electrode plate and the spark plug cable. Upon inadvertently permitting an entrance of foreign matter such as oil, water, dust, soil and the like between the electrode plate and the spark plug cable, it is apparently difficult to precisely detect the true static capacity therebetween. In order to prevent the entry of the foreign matter, the diameter of each of the grooves is the same as the spark plug cable, and the spark plug cable is placed in the Grooves by means of adhesive. Otherwise, the rubber plates are used to ensure a certain tightness between the Grooves and the spark plug cable by their elasticity.

In the case where the rubber plates tightly sandwich the spark plug cable due to their elasticity, it is found that the tightness between the Grooves and the spark plug cable becomes insufficient particularly when placing a plurality of spark plug cables extended from the internal combustion engine.

In the case where the spark plug cable is placed in the Grooves of the insulator body by means of adhesive, it is necessary to disadvantageously replace the detector probe itself upon exchanging the spark plug cable.

Therefore, it is an object of the invention to provide a spark plug voltage detector probe for use in internal combustion engines and in which the component parts are readily replaceable, and for precisely detecting the characteristics of the spark plug voltage waveform applied to each spark plug mounted on the respective cylinders with a relatively simple structure.

SUMMARY OF THE INVENTION

According to the invention, there is provided a spark plug voltage detector probe for use in internal combustion engine and which is mounted on a secondary circuit of an ignition circuit to form static capacity therebetween so as to detect a spark plug voltage waveform. An electrode plate is embedded in an insulator body to be electrically connected to a lead wire. A pair of insulator plates located under the insulator body, and each of the insulator plates having a grooves in which a spark plug cable is placed which is extended from the secondary circuit. Electromagnetic shield plates are provided to liquid-tightly sandwich the insulator body and the insulator plates by means of cable fixing bolts. The electromagnetic shield plates are electrically connected to an internal combustion engine for grounding. The electromagnetic shield plates are preferably made of an aluminum metal.

With the spark plug cable sandwiched by the insulator plates, it is possible to tightly fix even the cables extended from the internal combustion engine in position. With the use of the electrical shield plates, the bolt and nut, it is possible to maintain the liquid tightness enough to prevent the entry of foreign matter between the spark plug cable and the electrode plate, and at the same time, preventing an entry of outer disturbance noise which otherwise would affect the static capacity between the spark plug cable and the electrode plate. This makes it possible to precisely detect the spark plug voltage waveform applied to the spark plug with a relatively simple structure.

With the spark plug cable and the electrode plate of the insulator body detachably laminated by the cable fixing means, it is economically advantageous to only replace the cable fixer portion without exchanging the insulator body upon replacing the spark plug cables, since the cable and tier portion deteriorates more readily than the electrode plate of the insulator body.

These and other objects and advantages of the invention will be apparent upon reference to the following specification, attendant claims and drawings.

DETAILED DESCRIPTION OF THE PREFERRED EMBODIMENTS OF THE INVENTION

Figure 1:
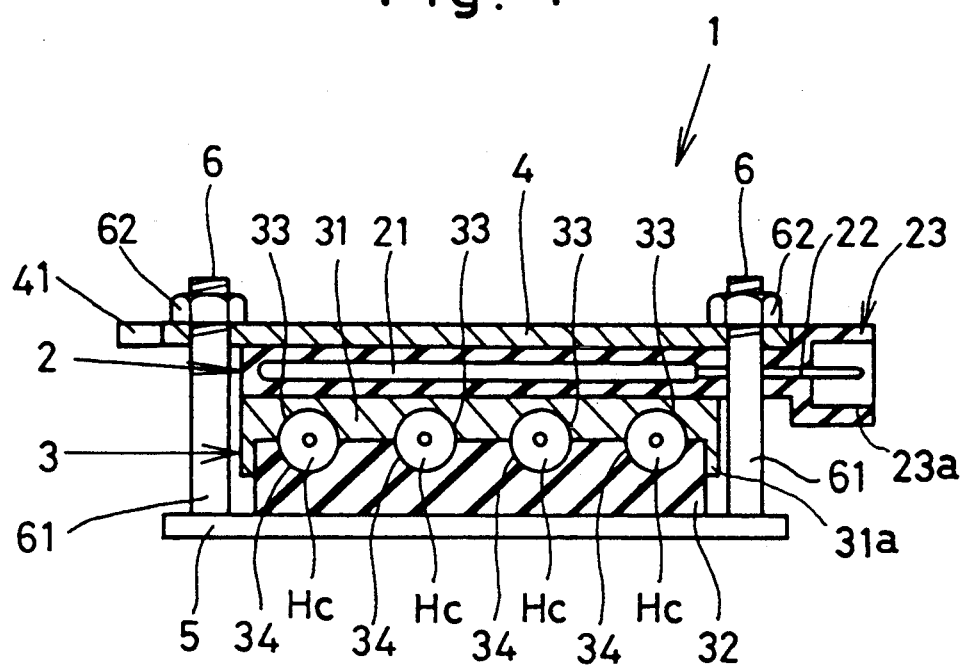
FIG. 1 is a latitudinal cross sectional view of a spark plug voltage waveform detector probe according to an embodiment of the invention.
Figure 2:
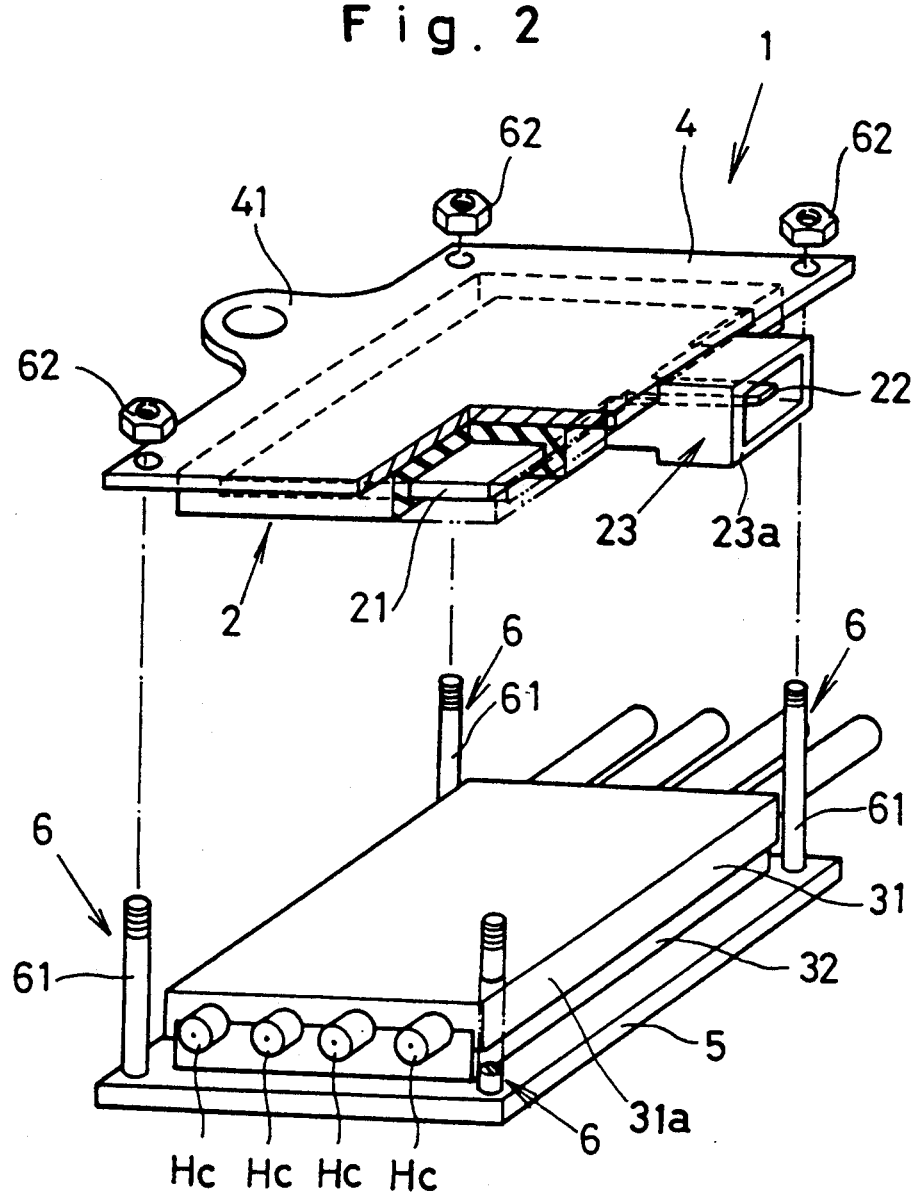
FIG. 2 is an exploded perspective view of the spark plug voltage waveform detector probe.

Referring to FIGS. 1, 2 which show a spark plug voltage waveform detector probe 1 according to an embodiment of the invention, an electrical insulator body 2 is provided to have an electrode plate 21 embedded therein. Around the insulator body 2, placed are a cable fixer portion 3, electromagnetic shield plates 4, 5 and a cable fixing means 6 which tightly sandwich the insulator body 2 and cable fixer portion 3 by way of the electromagnetic shield plates 4, 5. From the electrode plate 21 embedded in the insulator body 2, a lead wire 22 is introduced outside so as to form a connector 23 with an open box 23a integrally made in a manner so as to surround the lead wire 22. In this instance, the electrode plate 21 is embedded in the insulator body 2 simultaneously when the insulator body 2 is made by means of injection moulding. The shield plate 4 is tightly secured to an upper surface of the insulator body 2.

In the meantime, the cable fixer portion 3 has a pair of electrical insulator plates 31, 32 by which a spark plug cable (Hc) is sandwiched. An outer marginal part of the insulator plate 31 has a frame 31a which surrounds an outer periphery of the insulator plate 32 so as to readily place the insulator plate 31 in position when the plates laminated to each other. Opposing surfaces of insulator plates 31, 32 have an array of grooves 33, 34 in which the respective spark plug cables (Hc) are tightly placed. In this instance, the spark plug cable (Hc) may be provisionally placed in the grooves 33, 34 through an adhesive or the like. It is further predetermined that the diameter of grooves 33, 34 are substantially the same as that of the spark plug cable (Hc).

The electromagnetic shield plates 4, 5 are made of an aluminum flat metal so as to absorb electromagnetic waves induced by a high voltage applied to the spark plug, particularly by an intensified current flow caused by a capacitive discharge. The absorption of the electromagnetic waves makes it possible to neutralize an influence of noise on the static capacity between the electrode plate 21 and the spark plug cable (Hc). From the shield plate 4, an anchor tool 41 integrally extended which is formed at the time of moulding the shield plate 4. Through the anchor tool 41, the shield plate 4 is secured to an internal combustion engine (E), and at the same time, adapted to be grounded to the earth. In this instance, it is observed that the anchor tool 41 may be provided on the shield plate 5 from the reason that the shield plates 4, 5 are electrically connected by means of the cable fixing means 6.

The shield plates 4, 5 sandwich the insulator body 2 and the cable fixer portion 3 which are tightly laminated to each other physically by means of the cable fixing means 6. The cable fixing means 6 includes a metallic nut 62 and bolt 61 which secure one shield plate 4 to another shield plate 5 so as to maintain liquid-tightness between the insulator body 2 and the cable fixer portion 3. The cable fixing means 6 serves as not only a securement but also a conductor which electrically connects between the shield plates 4, 5 to absorb the electromagnetic waves so as to protect the detector probe 1 against any disturbance noise.

In the instance where the insulator body 2 and the cable fixer portion 3 are tightly laminated by means of the cable fixing means 6, it is necessary to make at least one of the insulator body 2 and the insulator plate 31 from an elastic material such as rubber, synthetic resin or the like in order to maintain the liquid-tightness of an interface between the insulator body 2 and the cable fixer portion 3.

Figure 3:
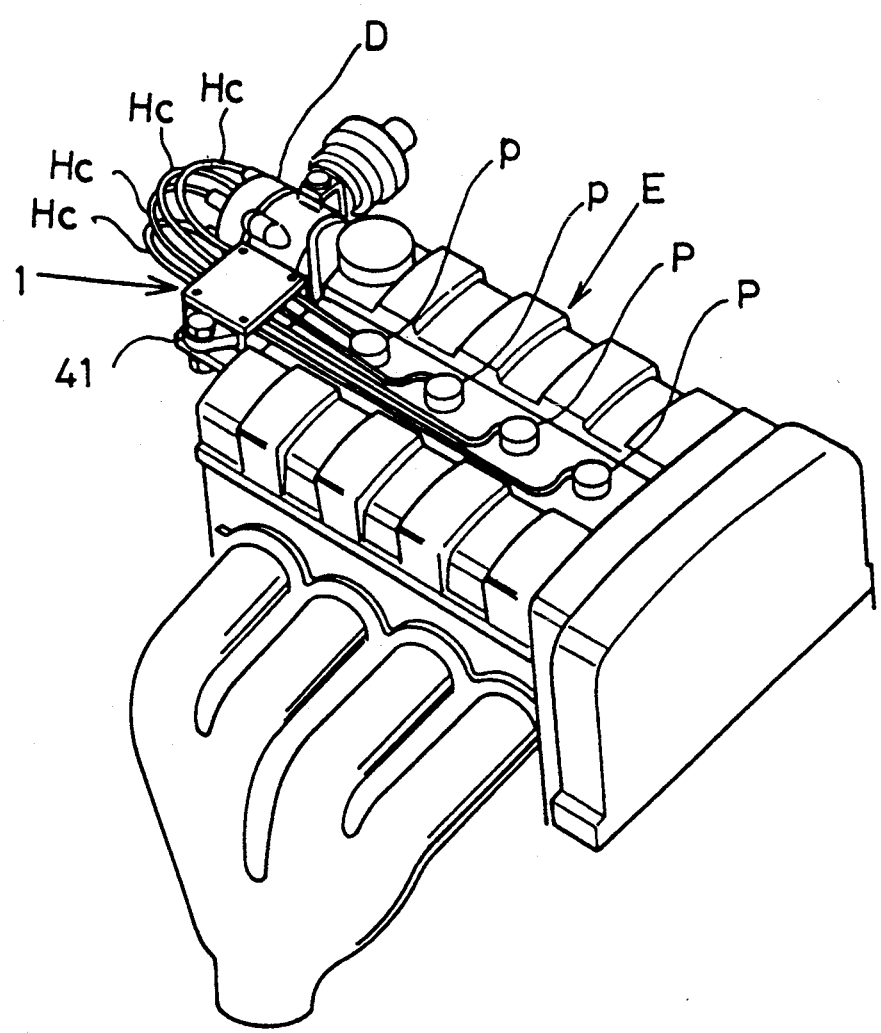
FIG. 3 is a perspective view of the spark plug voltage waveform detector probe mounted on an internal combustion engine.

The spark plug voltage waveform detector probe 1 is assembled as shown in FIG. 2, and mounted on the internal combustion engine (E) by way of the anchor tool 41 as shown in FIG. 3. The spark plug cable (Hc) electrically connects a spark plug (P) to a distributor (D) by way of the Grooves 33, 34 of the cable fixer portion 3 of the spark plug voltage waveform detector probe 1.

Figure 4:
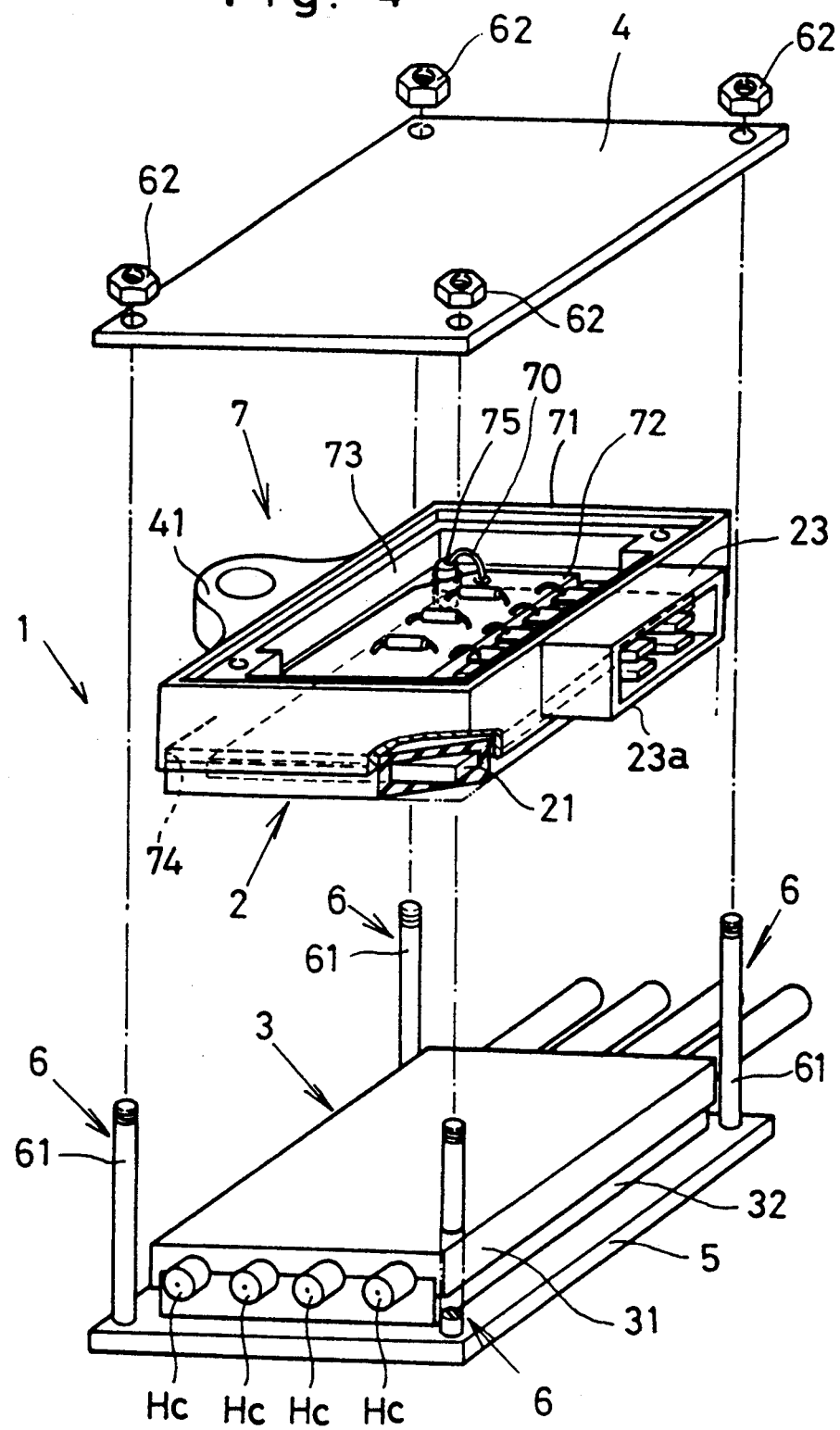
FIG. 4 is an exploded perspective view of the spark plug voltage waveform detector probe into which an electronic circuit is incorporated.

FIG. 4 shows an electronic circuit 7 of an spark plug voltage detector device incorporated into the spark plug voltage waveform detector probe 1 according to a modified form of the embodiment of the invention. In the modified form of the embodiment of the invention, an electromagnetic shield case 71 is made by aluminum die cast (rectangular parallelepiped), and povided between the shield plate 4 and the cable fixer portion 3. An upper space of the electromagnetic shield case 71 serves as an accommodation room 73 for a circuit board 72, and a lower space of the shield case 71 serving as a rectangular cavity 74 which accommodates the electrode plate 21 embedded in the insulator body 2 by means of an adhesive or the like. On a bottom wall of the shield case 71, a throughhole 75 is provided to introduce a lead wire 70. In this instance, the insulator body 2 and the cable fixer portion 3 are protected by the shield plate 5 and the bottom wall of the shield case 71. This obviates the necessity of integrally moulding the shield plate 4 at the time of making the insulator body 2 by means of injection moulding. For this reason, the shield plate 4 is provided to serve as a lid and shield for the accommodation room 73 and the electronic circuit 7, respectively. This neutralizes not only the influence of the noise on the static capaicity between the electrode plate 21 and the spark plug cable (Hc) but also on the electronic circuit 7 of the spark plug voltage detector device.

Figure 5:
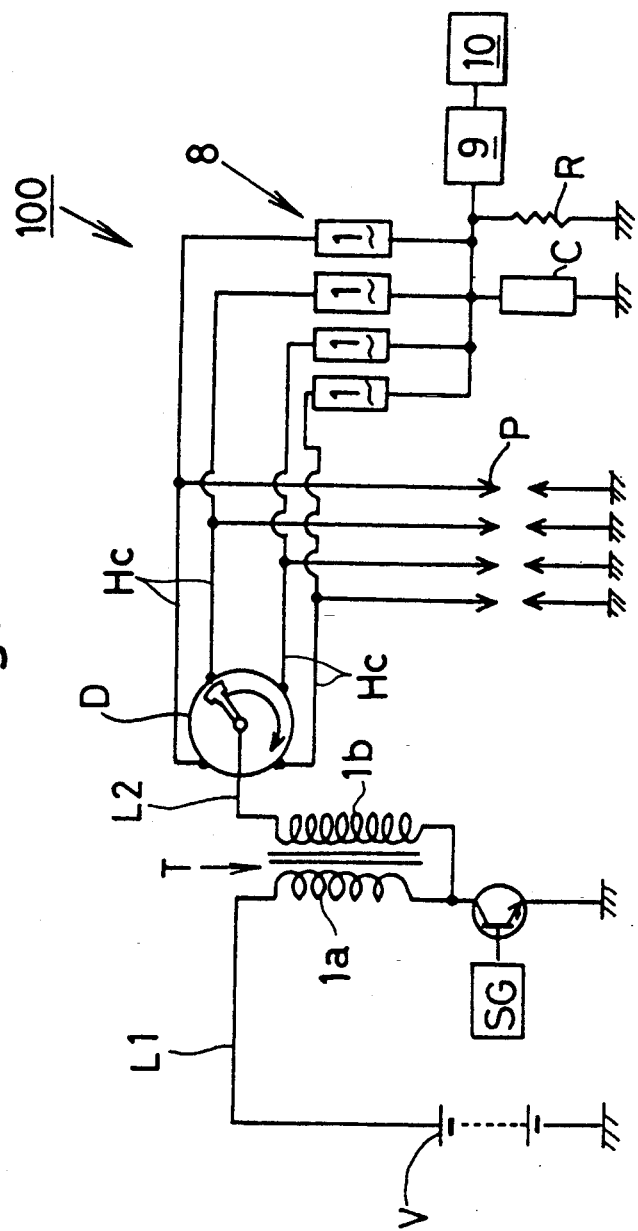
FIG. 5 is a connecting diagram of an ignition circuit into which the spark plug voltage waveform detector probe is incorporated.

FIG. 5 shows an ignition circuit 100 into which the spark plug voltage detector probe 1 is incoporated. The ignition circuit 100 has ignition coil T which includes a primary circuit L1 and secondary circuit L2 with a vehicular battery cell (V) as a power source. The primary circuit L1 have primary coil 1a electrically connected in series with a signal Generator (SG), while the secondary circuit L2 has secondary coil 1b electrically connected to the distributor (D) through which a high voltage is applied to the spark plug (P) mounted in each cylinder of the internal combustion engine (E).

Between the lead wire of the electrode plate of the spark plug voltage detector probe 1 and the Ground, a voltage divider circuit 8 is connected which consists of a capacitor C (3000 pF) and a resistor R (3MΩ) each connected in parallel. The voltage divider circuit 8 is connected to a spark plug voltage waveform detector circuit 9 which is connected to a distinction circuit 10 of a microcomputer.

When the ignition coil (T) supplies the high voltage with the spark plug (P) by way of the distributor (D) so as to provide the spark plug voltage, the static capacity formed between the electrode plate and the spark plug cable reaches to 1 pF.

The voltage divider circuit 8 divides the spark plug voltage induced from the secondary circuit L2 by the order of 1/3000, which makes it possible to determine the time constant of RC path to be approximately 9 milliseconds to render an attenuation time length of the spark plug voltage waveform relatively longer (approx. 3 milliseconds).

The spark plug voltage waveform detector circuit 9 detects a spark plug voltage waveform on the base of the output from the voltage divider circuit 8. The divided voltage waveform by the voltage divider circuit 8 is directly analogous to the spark plug voltage waveform applied to the spark plug (P). In the course of operating the internal combustion engine (E), it is found that the voltage waveform changes depending on whether or not the established spark discharge fires the air-fuel mixture gas, whether or not a misfire occurs in the cylinder of the internal combustion engine (E) and whether or not the jump spark miss occurs due to the deteriorated ignition coil (T), carbon fouling of the spark plug (P) or excess discharge of the vehicular battery cell (V).

After the spark plug voltage waveform detector circuit 9 analyzes the voltage waveform, the distinction circuit 10 compares the voltage waveform with data previously determined by theoretical calculation or experimental test results, and distinguishes the normal combustion from the misfire and the jump spark miss. Depending on these conditions, the distinction circuit 10 generates a different amount of output to feed it to a main computer which controls the internal combustion engine (E), or feeding a control signal to a fuel injector and an ignition timing control device (not shown).

It is noted in the embodiment of the invention, the capacitor (C) and the resistor (R) of the voltage divider circuit 8 are 3000 pF and 3M$\Omega$, respectively, however, the capacitor (C) and the resistor (R) are not limited to 3000 pF and 3M$\Omega$, but may be altered at discretion as required.

It is as a matter of course that the cross section of the spark plug cable (Hc) may be not only circular but also triangular, rectangular and polygonal, and the cross section of the groove would correspond to that of the spark plug cable.

It is also appreciated that the insulator body 2 and the cable fixer portion 3 may be made of silicone rubber or other type of plastic materials respectively.

It is appreciated that the cable fixing means 6 may be made from an aluminum metal.

It is further observed that an entire surface of the electromagnetic shield case 71 may be coated by means of aluminum deposit or evaporation instead of making it by the aluminum metal.

It is appreciated that instead of using the nut and bolt combination, the shield plate 4 may be directly secured to the shield plate 5 by means of a screw stud.

It also stands as a matter of course that the entire surface of each of the shield plates 4, 5 may be coated by means of aluminum deposit or evaporation instead of making them by the aluminum metal.

While the invention has been described with reference to the specific embodiments, it is understood that this description is not to be construed in a limiting sense in as much as various modifications and additions to the specific embodiments may be made by the skilled artisan without departing from the spirit and scope of the invention.

What is claimed is:

1. A spark plug voltage waveform detector probe for use in an internal combustion engine and which is mounted on a secondary circuit of an ignition circuit to form static capacity therebetween so as to detect a spark plug voltage waveform, said detector probe comprising:

an insulator body;

an electrode plate embedded in said insulator body and which is electrically connected to a lead wire;

a pair of readily replaceable insulator plates located under said insulator body, each of said insulator plates having at least one groove, said at least one groove of each of said insulator plates opposing each other and cooperating to form an opening in which a spark plug cable is placed which is extended from the secondary circuit;

electromagnetic shield plates which liquid-tightly sandwich said insulator body and said insulator plates so as to form a laminated detector probe structure, said electromagnetic shield plates being electrically connected to the internal combustion engine for grounding; and fixing means for securing together said laminated detector probe structure.

2. A spark plug voltage waveform detector probe for use in an internal combustion engine as recited in claim 1, wherein said the electromagnetic shield plates are made of an aluminum metal.

* * * * *